(12) United States Patent
Mauder et al.

(10) Patent No.: US 10,989,742 B2
(45) Date of Patent: Apr. 27, 2021

(54) MAGNETIC CURRENT SENSOR

(71) Applicant: Infineon Technologies Austria AG, Villach (AT)

(72) Inventors: Anton Mauder, Kolbermoor (DE); Martin Gruber, Schwandorf (DE); Goran Keser, Munich (DE)

(73) Assignee: Infineon Technologies Austria AG, Villach (AT)

( * ) Notice: Subject to any disclaimer, the term of this patent is extended or adjusted under 35 U.S.C. 154(b) by 12 days.

(21) Appl. No.: 16/424,631

(22) Filed: May 29, 2019

(65) Prior Publication Data

US 2019/0369144 A1 Dec. 5, 2019

(30) Foreign Application Priority Data

May 30, 2018 (DE) .......................... 102018113005.8

(51) Int. Cl.
*G01R 15/20* (2006.01)
*H01L 25/16* (2006.01)
(Continued)

(52) U.S. Cl.
CPC ......... *G01R 15/205* (2013.01); *G01R 15/202* (2013.01); *G01R 19/0092* (2013.01);
(Continued)

(58) Field of Classification Search
CPC .......................... G01R 15/205; G01R 19/0092; G01R 15/202; H01L 25/165; H01L 43/02;
(Continued)

(56) References Cited

U.S. PATENT DOCUMENTS

| 7,375,507 B2 * | 5/2008 | Racz ................... G01R 15/207 324/117 H |
| 2007/0164727 A1 * | 7/2007 | Racz ................... G01R 15/207 324/142 |

(Continued)

FOREIGN PATENT DOCUMENTS

| CN | 200959021 Y | 10/2007 |
| CN | 101495874 A | 7/2009 |

(Continued)

OTHER PUBLICATIONS

Tesche, Frederick M., "EMC Analysis Methods and Computational Models", Beijing University of Posts and Telecommunications Press, John Wiley & Sons, 1997, p. 58.

*Primary Examiner* — Christopher P McAndrew
*Assistant Examiner* — Zannatul Ferdous
(74) *Attorney, Agent, or Firm* — Murphy, Bilak & Homiller, PLLC

(57) ABSTRACT

A current sensor and a current sensing method are disclosed. The current sensor includes a sensor chip having a first chip surface, a second chip surface and at least one sensor element, and a housing having a first housing surface adjoining the second chip surface and a second housing surface spaced apart from the first housing surface and separated from the first housing surface by a spacer section of the housing. The second housing surface is configured to be mounted on a conductor and is electrically insulating.

20 Claims, 10 Drawing Sheets

(51) Int. Cl.
  *H01L 43/02*     (2006.01)
  *H01L 43/06*     (2006.01)
  *H01L 43/08*     (2006.01)
  *H01L 43/12*     (2006.01)
  *G01R 19/00*     (2006.01)

(52) U.S. Cl.
  CPC ............ *H01L 25/165* (2013.01); *H01L 43/02* (2013.01); *H01L 43/06* (2013.01); *H01L 43/08* (2013.01); *H01L 43/12* (2013.01)

(58) Field of Classification Search
  CPC ......... H01L 43/08; H01L 43/12; H01L 43/06; H01L 25/16
  See application file for complete search history.

(56) References Cited

U.S. PATENT DOCUMENTS

| | | | |
|---|---|---|---|
| 2008/0310663 A1* | 12/2008 | Shirasaka | H04R 19/016 |
| | | | 381/355 |
| 2015/0311788 A1 | 10/2015 | Nandi et al. | |
| 2017/0084703 A1* | 3/2017 | Ku | H01L 29/7391 |
| 2017/0338176 A1* | 11/2017 | Tsuyuno | H01L 25/072 |
| 2018/0122960 A1* | 5/2018 | Chang | G01J 5/20 |

FOREIGN PATENT DOCUMENTS

| | | |
|---|---|---|
| CN | 101788596 A | 7/2010 |
| CN | 102401851 A | 4/2012 |
| DE | 102014109609 A1 | 1/2015 |
| DE | 102017112511 A1 | 12/2017 |

\* cited by examiner

_US 10,989,742 B2_

MAGNETIC CURRENT SENSOR

TECHNICAL FIELD

This disclosure in general relates to a magnetic current sensor.

BACKGROUND

A magnetic current sensor is a current sensor that is configured to indirectly measure a current flowing through a conductor by sensing and measuring a magnetic field caused by the current. For any given current flowing through the inductor, a field strength of the magnetic field sensed by the current sensor is dependent on a distance between the current sensor and the conductor, wherein the field strength decreases as the distance increases.

SUMMARY

There is therefore a need for a magnetic current sensor that allows for a precise and easy adjustment of a distance between a sensor element of the current sensor and a conductor.

One example relates to a current sensor. The current sensor includes a sensor chip with a first chip surface, a second chip surface, and at least one sensor element. The current sensor further includes a housing with a first housing surface adjoining the second chip surface and a second housing surface spaced apart from the first housing surface and separated from the first housing surface by a spacer section of the housing, wherein the second housing surface is configured to be mounted on a conductor and is electrically insulating.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and show, for the purpose of illustration, examples of how the invention may be used and implemented. It is to be understood that the features of the various embodiments described herein may be combined with each other unless specifically noted otherwise.

Figure 1A:
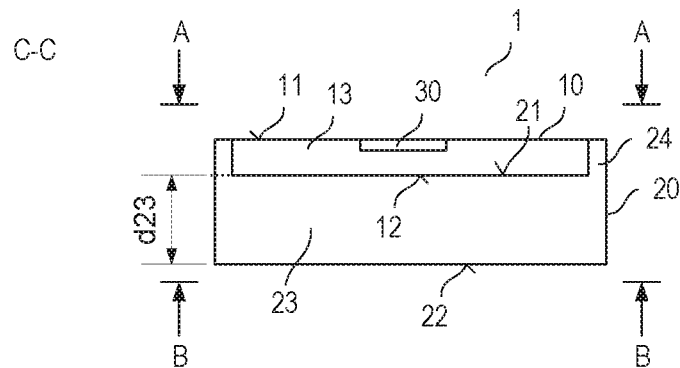
FIGS. 1A-1C show different views of a current sensor according to one example.
Figure 1B:
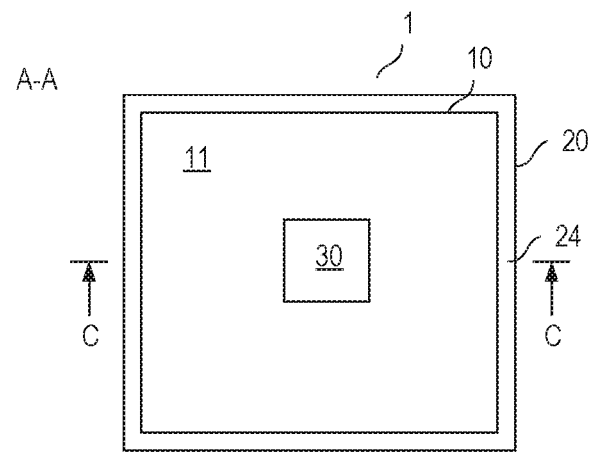
Figure 1C:
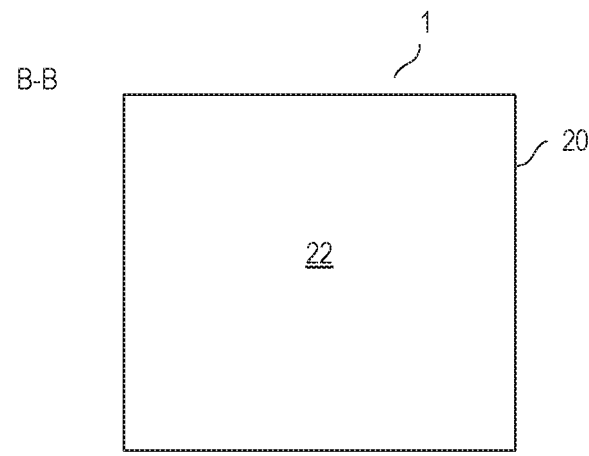

FIGS. 1A to 1C show a vertical cross sectional view, a first top view, and a second top view, respectively, of a current sensor 1 according to one example. The current sensor 1 includes a sensor chip 10 with a first chip surface 11, a second chip surface 12, and at least one sensor element 30. According to one example, the sensor element 30 is a magnetic sensor element, so that the current sensor 1 may also be referred to as a magnetic current sensor.

Referring to FIGS. 1A-1C, the current sensor 1 further includes a housing 20 having a first housing surface 21 adjoining the second chip surface 12 of the sensor chip 10 and a second housing surface 22. The second housing surface 22 is spaced apart from the first housing surface 21 and is separated from the first housing surface 21 by a spacer section 23 of the housing 20. The second housing surface 22 is configured to be mounted on a conductor (not illustrated in FIGS. 1A to 1C) and is electrically insulating. Referring to FIG. 1C, which shows a top view of the second housing surface 22, the second housing surface 22 may entirely be formed of an electrically insulating material and may be designed such that it does not include any electrically conducting contact surfaces (contact pads).

The housing 20 may include an epoxy based resin and can be formed in an injection molding process. The sensor chip 10 can be embedded into the housing 20 in this injection molding process.

According to one example, the at least one sensor element 30 is configured to detect a magnetic field associated with a current flowing through a conductor on which the second housing surface 22 of the current sensor 1 may be mounted, wherein the spacer section 23 provides for a galvanic isolation between the conductor and the sensor chip 10. A field strength of the magnetic field at the position at which the sensor element 30 is located is dependent on a current level of the current through the conductor and a distance between the sensor element 30 and the conductor. In the current sensor shown in FIG. 1A, this distance is given by (a) a distance between the sensor element 30 and the second housing surface 22 and (b) a distance between the second housing surface 22 and the conductor.

(a) The distance between the sensor element 30 and the second housing surface 22 is given by (i) a distance between the sensor element 30 and the second chip surface 12, and (ii) a distance d23 between the first housing surface 21 and the second housing surface 22, wherein this distance d23 is equivalent to a dimension of the spacer section 23 in a direction perpendicular to the second housing surface 22. (i) The distance between the sensor element 30 and the second chip surface 12 is given by a design of the sensor chip 10 and is well defined. (ii) The distance d23 between the first and second housing surface 21, 22 is also well defined and dependent on the design of the housing 20.
(b) The distance between the second housing surface 22 and the conductor is either well defined by the process of mounting the current sensor onto the conductor or can be neglected.

According to one example, the housing 20 is designed such that the distance between the first and second housing surfaces 21, 22 is between 30 (micrometers) µm and 4 millimeters (mm), in particular between 100 µm and 2 mm or between 200 µm and 1 mm.

Summarizing the above, in the current sensor 1 of the type shown in FIGS. 1A to 1C the distance between the sensor element 30 and the conductor is well defined and known so that the field strength of the magnetic field sensed by the sensor element 30 can be considered to only be dependent on the current level of the current through the conductor.

In the current sensor of the type shown in FIGS. 1A-1C, the distance d23 between the first and second housing surfaces 21, 22 can be varied by the design of the housing 20. That is, one and the same type of sensor chip can be embedded in different types of housings 20, wherein the housings are different from each other in the distance d23 between the first and second housing surfaces 21, 22. According to another example, only one type of housing 20 with one distance d23 between the first and second housing surfaces 21, 22 is produced and the distance d23 is adjusted by thinning the spacer section 23 to the desired thickness. The "thickness" of the spacer section 23 is the distance between the first and second housing surfaces 21, 22. Thinning the spacer section 23 may include any kind of an abrasive process such as a polishing process, a grinding process, or the like.

Referring to the above, the distance between the sensor element 30 and the second chip surface 12 is given by a design of the sensor chip 10. Nevertheless, variations of this distance may also occur as a thickness of the sensor chip 10 may vary due to manufacturing tolerances. Such variations of the chip thickness can be compensated by suitably adjusting the distance d23 between the first and second housing surfaces 12, 22, that is, by suitably adjusting the thickness of the spacer section 23. Thus, variations of the chip thickness do not affect the distance between the sensor element 30 and the second housing surface 22.

The at least one sensor element 30 can be any type of sensor element configured to sense a magnetic field and output a signal that is representative of a field strength of the sensed magnetic field. Examples of the at least one sensor element 30 include, but are not restricted to: an Anisotropic Magneto-Resistive (AMR) sensor; a Colossal Magneto-Resistive (CMR) sensor; an Extraordinary Magneto-Resistive (EMR) sensor; a Giant Magneto-Resistive (GMR) sensor; a Tunneling Magneto-Resistive (TMR) sensor; or a Hall sensor. Magneto-resistive sensors of the type mentioned before are also referred to as xMR sensors. xMR sensors may be implemented as thin film sensors that can be formed in or on top of the sensor chip 10. The at least one sensor element 30 is only schematically illustrated in FIGS. 1A and 1B. In addition to a structure that is sensitive to a magnetic field, the sensor element 30 further includes two or more contact pads configured to provide a power supply to the sensor element 30 and to output the signal representing the sensed magnetic field. Such contact pads, however, are not illustrated in FIGS. 1A and 1B.

The sensor chip 10 further includes a semiconductor body 13. According to one example, the semiconductor body 13 is a monocrystalline semiconductor body. According to one example, the semiconductor body 13 comprises monocrystalline silicon (Si) or monocrystalline silicon carbide (SiC). The semiconductor body 13 acts as a carrier for the at least one sensor element 30. Optionally, in the semiconductor body 13 additional electrical functionality may be included like, e.g., an integrated electric circuit, which, e.g., may be configured to process signals delivered by the sensor element 30.

Referring to FIGS. 1A and 1B, the housing 20 may be produced such that it does not cover the first chip surface 11. The housing 20 may include a frame section 24 that laterally surrounds the sensor chip 10 so that the housing 20 adjoins five surfaces of the sensor chip 10, the second chip surface 12, which may also be referred to as bottom surface, and four vertical surfaces adjoining the second chip surface 12 but the housing does not adjoin the first chip surface 11.

Figure 2:
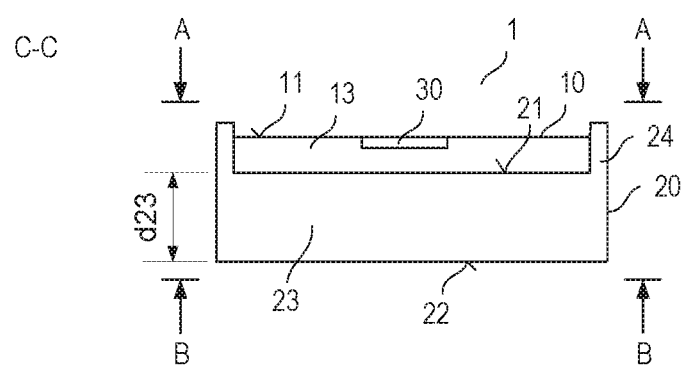
FIG. 2 shows a vertical cross sectional view of a current sensor according to another example.

Referring to FIG. 1A, the frame section 24 of the housing 20 and the first chip surface 11 may essentially form a planar surface. According to another example shown in FIG. 2, the frame section 24 extends beyond the first chip surface 11 in a vertical direction of the current sensor. The "vertical direction" of the current sensor is a direction perpendicular to the first and second chip surfaces 11, 12 and the first and second housing surfaces 21, 22.

Figure 3:
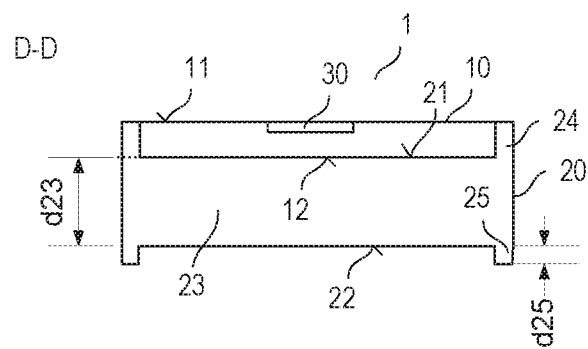
FIG. 3 shows a vertical cross sectional view of a current sensor according to another example.
Figure 4A:
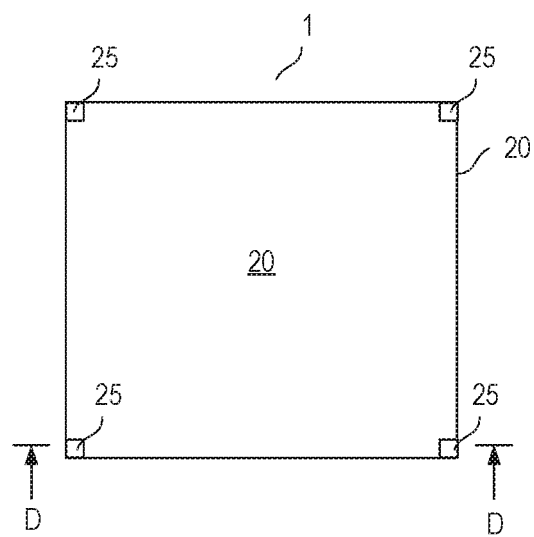
FIGS. 4A-4C show different examples of a housing surface of a current sensor of the type shown in FIG. 3.
Figure 4B:
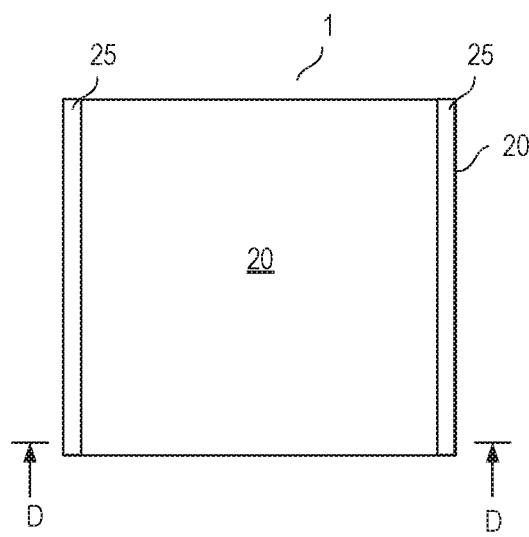
Figure 4C:
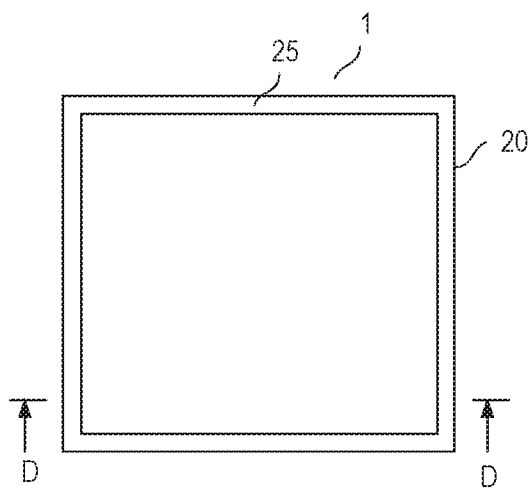

FIG. 3 shows a vertical cross sectional view of a current sensor 1 according to another example. In this example, the housing 20 includes at least one spacer 25 protruding from the second housing surface 22. The at least one spacer 25 is part of the housing 20 and can include the same type of material as the remainder of the housing 20 such as an epoxy based resin. Different examples of the at least one spacer 25 are illustrated in FIGS. 4A to 4C. According to one example, the at least one spacer 25 is designed such that its height, which is the dimension in a direction perpendicular to the second housing surface 22, is between 5 micrometer (µm) and 200 micrometer (µm), in particular between 10 µm and 100 µm.

According to one example shown in FIG. 4A, the at least one spacer 25 includes a plurality of spacers 25 that are arranged spaced apart from each other. Just for the purpose of illustration, each of the spacers 25 shown in FIG. 4A has a rectangular cross section. Any other type of cross section such as, for example, an elliptical cross section or a polygonal cross section may be implemented as well. According to another example shown in FIG. 4B, the at least one spacer 25 includes two elongated spacers that are spaced apart from each other. The arrangements shown in FIGS. 4A and 4B represent only two of many different examples; it goes without saying that the spacers shown in FIGS. 4A and 4B may also be arranged in other areas of the second housing surface 22. According to another example shown in FIG. 4C, the housing 20 includes one spacer 25 that is ring-shaped. Of course, different types of spacers 25 can be combined in one housing.

In the type of current sensor 1 shown in FIG. 3, the at least one spacer 25 can be brought into contact with the conductor so that the at least one spacer 25 defines a space between the conductor and those sections of the second housing surface 22 at which no spacer 25 is arranged. This space can be filled with a mounting material such as a glue in order to mount the second housing surface 22 to the conductor. Due to the spacers 25, a distance between the conductor and the spacer section 23 and therefore, between the sensor element 30 and the conductor, is well defined.

Figure 5:
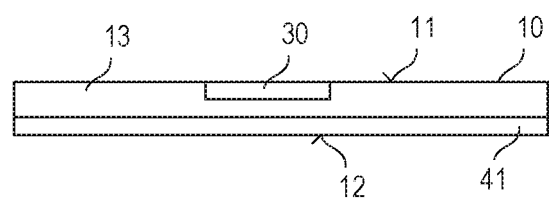
FIG. 5 shows a vertical cross sectional view of a sensor chip according to one example.

FIG. 5 shows a vertical cross sectional view of one example of the sensor chip 10 in greater detail. In this example, the sensor chip 10 includes an electrical conducting layer 41 that forms the second chip surface 12. According to one example, this electrically conducting layer 41 is a metal layer formed on the semiconductor body 13 of the sensor chip 10. According to another example, the electrical conducting layer 41 is a part of the sensor chip 13 and is a highly doped monocrystalline semiconductor layer. According to one example, a doping concentration of this highly doped semiconductor layer is higher than 1E19 cm$^{-3}$.

Figure 6:
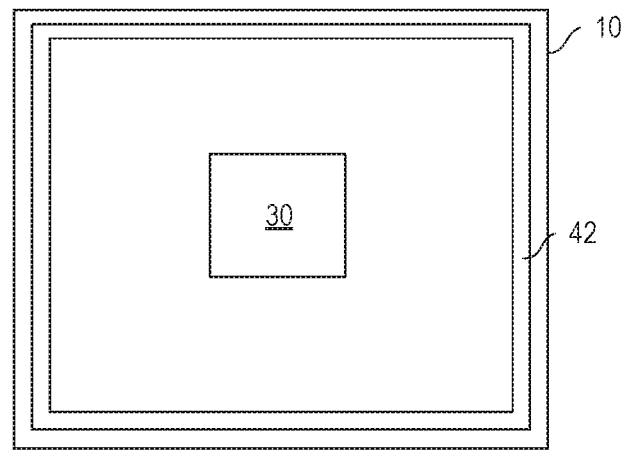
FIG. 6 shows a top view of a sensor chip according to one example.

Referring to FIG. 6, which shows a top view of the first chip surface 11, the sensor chip 10 may further include an electrically conducting ring 42 that laterally surrounds a region of the sensor chip 10 in which the at least one sensor element 30 is integrated. The electrically conducting ring can be formed on top of the surface of the semiconductor body 13 or in a trench formed in the surface 11 of the sensor chip 10 (the semiconductor body 13). According to one example, the electrically conducting ring 42 includes a metal such as, for example, aluminum (Al), copper (Cu), titanium (Ti), silver (Ag), or tungsten (W). According to another example, the electrically conducting ring 42 includes a highly doped crystalline semiconductor material such as polysilicon.

According to one example, the sensor chip 10 includes both the electrically conducting layer 41 illustrated in FIG. 5 and the electrically conducting ring 42 shown in FIG. 6, wherein the layer 41 and the ring 42 are electrically connected with each other. According to one example, the ring 42 and the layer 41 are electrically connected by at least one electrically conducting via extending from the ring 42 through the sensor chip 10 to the electrically conducting layer 41. The electrically conducting layer 41 helps to avoid or at least reduce a capacitive coupling of the sensor element and the conductor.

Referring to the above, the sensor chip 10 includes at least one sensor element, wherein, in the examples previously explained herein, only one sensor chip 30 is shown. According to one example shown in FIG. 7, two sensor elements $30_1$, $30_2$ are integrated in the sensor chip 10 at different positions. According to another example shown in FIG. 8, four sensor elements $30_1$, $30_2$, $30_3$, $30_4$ are integrated in the sensor chip 10 at different positions.

Figure 7:
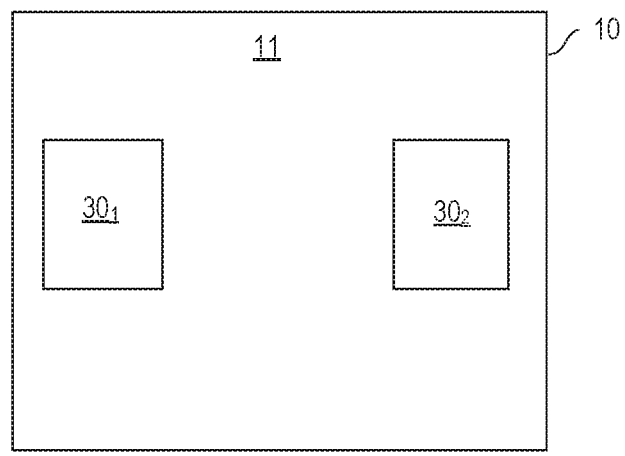
FIG. 7 shows a top view of a sensor chip including two sensors.

According to a further example (not shown in the figures), in a configuration with four sensor elements two sensor elements may be placed one upon the other. For example, in a configuration as shown in FIG. 7, instead of the first sensor element $30_1$ two sensor elements (such as sensor elements $30_1$ and $30_4$ shown in FIG. 8) may be stacked one above the other, and instead of the second sensor element $30_2$ two sensor elements (such as sensor elements $30_2$ and $30_3$ shown in FIG. 8) may be stacked one above the other.

Figure 8:
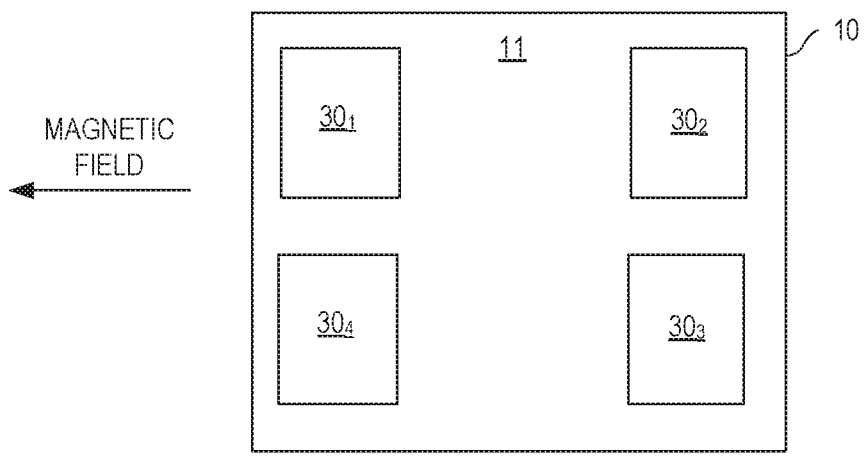
FIG. 8 shows a top view of a sensor chip including four sensors.
Figure 9:
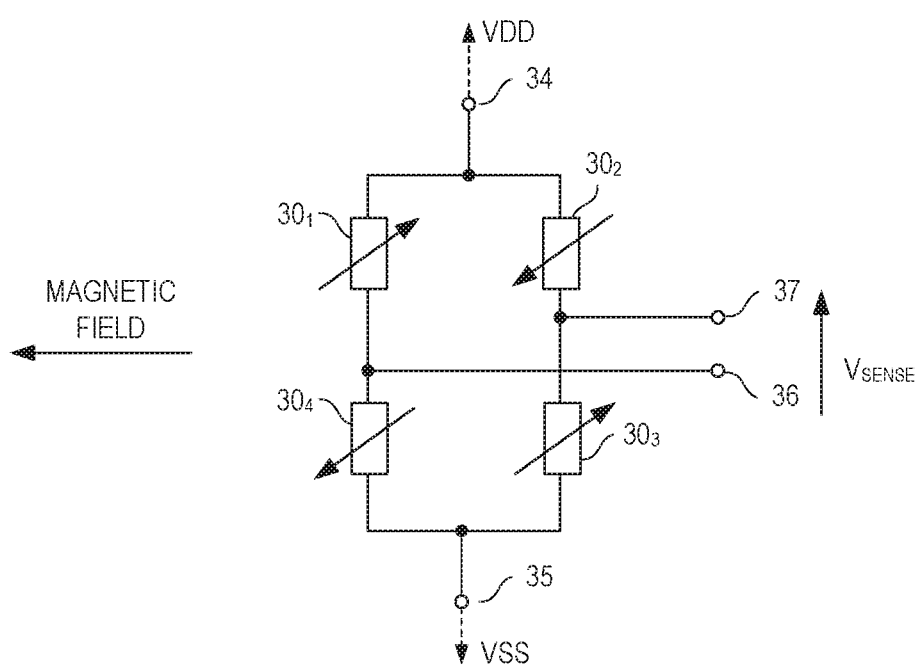
FIG. 9 shows a circuit diagram of a current sensor of the type shown in FIG. 8.

According to one example, each of the four sensor chips $30_1$-$30_4$ shown in FIG. 8 is a magneto-resistive sensor element, and these sensor elements are connected to form a sensor bridge. A circuit diagram of such sensor bridge is illustrated in FIG. 9. In FIG. 9, each of the four sensor elements $30_1$-$30_4$ is represented by a variable resistor. The sensor bridge includes two series circuits each including two sensors, wherein each of these series circuits is connected between a first supply node 34 and a second supply node 35. These supply nodes 34, 35 are configured to receive a supply voltage that is available between a first supply potential $V_{DD}$ and a second supply potential $V_{SS}$. A tap of a first one of the two series circuits forms a first output node 36 and a tap of a second one of the two series circuits forms a second output node 37 of the sensor bridge.

Each of the sensor chips $30_1$-$30_4$ forms an electrical resistor between a respective one of the supply nodes 34, 35 and a respective one of the taps 36, 37, wherein a resistance of this resistor is dependent on a magnitude of a magnetic field sensed by the respective sensor chip $30_1$-$30_4$. According to one example, the two sensor chips forming one series circuit have an opposite resistance characteristic in such a way that the resistance of one of these sensor chips increases and the resistance of the other one of the sensor chips decreases when the magnitude of a magnetic field increases. Further, according to one example, the two sensor chips connected to the same supply node 34, 35 have different resistance characteristics.

For the purpose of illustration it is assumed that a first sensor element $30_1$ connected between the first supply node 34 and the tap 36 of a first one of the series circuits and a third sensor element $30_3$ connected between the second supply node 35 and the tap 37 of a second one of the series circuits have the same resistance characteristic such that the resistance increases as the magnitude of a magnetic field with a given orientation increases and such that the resistance decreases as the magnitude of a magnetic field with an opposite orientation increases. According to one example, the first and third sensor elements $30_1$, $30_3$ are such that their respective resistance increases when a magnitude of a magnetic field having an orientation as shown in FIGS. 8 and 9 increases and that their respective resistance decreases when a magnitude of a magnetic field having an orientation opposite to the orientation shown in FIGS. 8 and 9 increases. Further, it is assumed, that a second sensor element $30_2$ connected between the first supply node 34 and the tap 37 of the second series circuit and a fourth sensor element $30_4$ connected between the second supply node 35 and the tap 36 of the first series circuit have the same resistance characteristic such that the resistance decreases as the magnitude of the magnetic field with the given orientation increases and such that the resistance increases as the magnitude of a magnetic field with the opposite orientation increases. According to one example, the second and fourth sensor elements $30_2$, $30_4$ are such that their respective resistance decreases when a magnitude of the magnetic field having the orientation as shown in FIGS. 8 and 9 increases and that their respective resistance increases when a magnitude of a magnetic field having an orientation opposite to the orientation shown in FIGS. 8 and 9 increases. When the magnitude of the magnetic field sensed by the sensor chips $30_1$-$30_4$ is zero, a voltage $V_{SENSE}$ between the first tap 36 and the second tap 37 has a quiescent level that can be zero or different from zero. Further, when the magnitude of the electric field is different from the zero, the voltage $V_{SENSE}$ has a voltage level that deviates from the quiescent level, wherein a sign of a difference between this voltage level and the quiescent level is dependent on the orientation of the magnetic field and a magnitude of the difference is dependent on the magnitude of the magnetic field. The orientation of the magnetic field is dependent on a direction of a current causing the magnetic field, and a magnitude of the electric field is dependent on a current level of the current. Thus, the deviation of the voltage level of the sense voltage $V_{SENSE}$ from the quiescent level represents the current causing the magnetic field.

Figure 10:
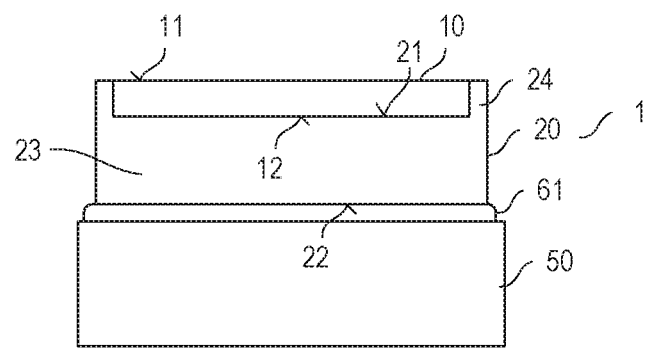
FIG. 10 shows a vertical cross sectional view of an arrangement including a conductor and a current sensor mounted on the conductor.
Figure 11:
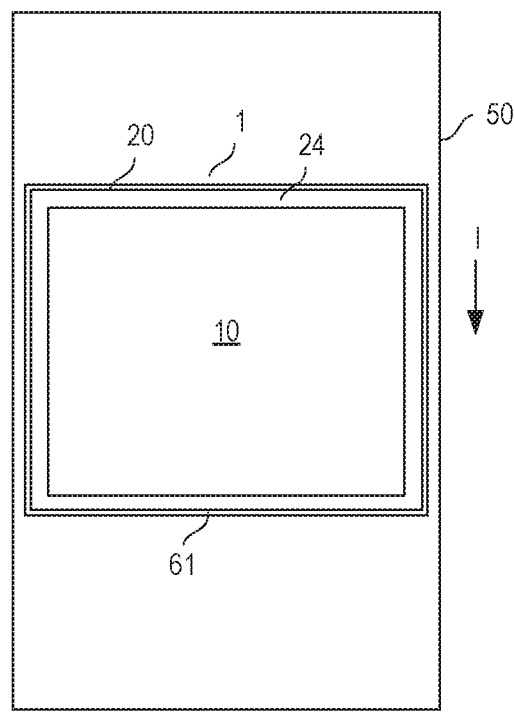
FIG. 11 shows a top view of an arrangement of the type shown in FIG. 10 according to one example.

FIG. 10 shows a vertical cross sectional view of an arrangement that includes a conductor 50 and a current sensor 1 mounted on the conductor 50. The current sensor 1 is a current sensor of any of the types previously explained herein, wherein in FIG. 10 only the housing 20 and the sensor chip 10 are illustrated; the at least one sensor element integrated in the sensor chip 10 is not shown in FIG. 10. Referring to FIG. 10, the current sensor 1 is mounted on the conductor 50 in that the second housing surface 22 of the housing 20 is mounted on the conductor 50. In this example, mounting the housing 20 onto the conductor 50 includes gluing the housing 20 to the conductor 50 using a glue 61. A top view of a section of the conductor 50 on which the current sensor 1 is mounted is shown in FIG. 11. In the example shown in FIG. 11, the conductor 50, in a direction perpendicular a current flow direction, is wider than the housing of the current sensor 20. This, however, is only an example. According to another example, the housing of the current sensor is wider than the conductor 50. The "current flow direction" is a direction in which a current flows through the conductor 50. This current flow direction is represented by an arrow labeled with "I" in FIG. 11.

The conductor 50 can be any kind of conductor, in particular, any kind of flat conductor. Examples of the conductor 50 include, but are not restricted to: a trace of a PCB (Printed Circuit Board), a conductor of DCB (Direct Copper Bonding) substrate, a contact clip connected to a contact pad of a power semiconductor device, or the like.

In the example illustrated in FIG. 10, a distance between the conductor 50 and the second housing surface 22 is defined by a thickness of the glue 61. According to one example, a thickness of the glue is in the range of between 5 (micrometers) μm and 200 micrometers (μm), in particular between 10 μm and 100 μm. The thickness of the glue contributes to the distance between the conductor 50 and the sensor element 30 so a tolerance in the thickness of the glue 61 will contribute to a tolerance in the distance between the conductor 50 and the sensor element 30. According to one example, in order to provide a low absolute tolerance in the distance between the conductor 50 and the sensor element 30, a (nominal) thickness of the glue 61 is selected such that it is less than 50%, less than 25%, less than 10%, less than 5%, or even less than 1% of the thickness d23 of the spacer section 23.

Figure 12:
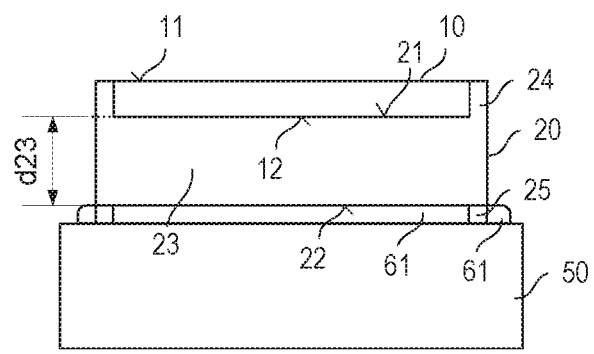
FIG. 12 shows an arrangement with a conductor and a current sensor of the type shown in FIG. 3 mounted on the conductor.

FIG. 12 shows an arrangement of the type shown in FIG. 10 according to another example. In this example, the current sensor 1 includes at least one spacer 25 at the second surface 22. In this example, the at least one spacer 25 adjoins the conductor and a space between the conductor 50 and the remaining sections of the second housing surface 22 are filled by the glue 61. In this example, the glue 61 connects the housing 20 to the conductor 50 and a distance between the second housing surface 22 and the conductor 50 is defined by the at least one spacer 25.

Figure 13A:
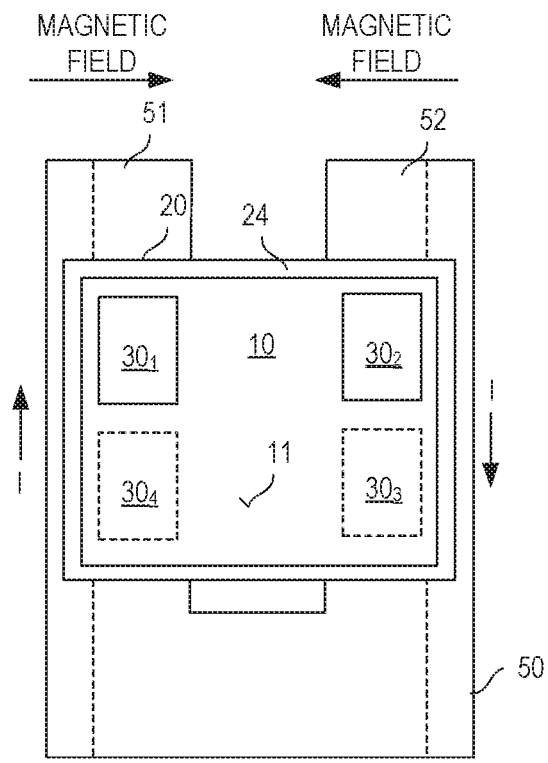
FIG. 13A shows a top view of an arrangement including a U-shaped conductor and a current sensor mounted on the conductor.

FIG. 13A shows an arrangement with a conductor 50 and a current sensor 1 according to another example. In this example, the conductor 50 is U-shaped and includes two legs 51, 52 separated by a gap 53. The current sensor 1 is mounted on the first leg 51 and the second leg 52 and bridges the gap 53. According to one example, the current sensor 1 is mounted on the first and second legs 51, 52 such that it is spaced apart from a conductor section 54 that connects the first and the second leg 51, 52. According to one example, the current sensor 1 includes at least two sensor elements $30_1$, $30_2$ that are spaced apart from each other. According to one example, the current sensor 1 is mounted on the conductor 50 such that a first one $30_1$ of the at least two sensor elements $30_1$, $30_2$ is located above a first one 51 of the two legs 51, 52 and that a second one $30_2$ of the two sensor elements $30_1$, $30_2$ is located above a second one 52 of the two legs 51, 52. A current I flowing through the conductor 50 has opposite current directions relative to the current sensor 1 in the first leg 51 and the second leg 52, so that a magnetic field caused by the current flowing through the first leg 51 and a magnetic field caused by the current flowing through the second leg 52 have opposite signs. According to one example, a signal generated by the first sensor element $30_1$, which mainly senses the magnetic field caused by the current in the first leg 51, is subtracted from a signal generated by the second sensor element $30_2$, which mainly senses the magnetic field caused by the current in the second leg 52. In this way, a sensor signal is obtained that has a magnitude which is approximately twice a magnitude of the sensor signal generated by a single sensor element $30_1$, $30_2$. Further, a parasitic magnetic field that is sensed by both the first sensor element $30_1$ and the second sensor element $30_2$ does not affect the signal obtained by subtracting the sensor signals.

In the example illustrated in FIG. 13A, each of the first and second legs 51, 52 protrude from the sensor 1 in a direction perpendicular to the current flow direction. This, however, is only an example. According to another example (illustrated in dashed lines in FIG. 13A) the current sensor 1 extends beyond each of the first and second legs 51, 52 in the direction perpendicular to the current flow direction.

Further, in the example illustrated in FIG. 13A the current sensor 1 includes two sensor elements $30_1$, $30_2$ (illustrated in solid lines). This, however, is only an example. According to another example (illustrated in dashed lines in FIG. 13A) the current sensor 1 includes four sensor elements $30_1$-$30_4$, wherein two $30_1$, $30_4$ of these sensor elements $30_1$-$30_4$ are located above the first leg 51 and two $30_2$, $30_3$ of the sensor elements $30_1$-$30_4$ are located above the second leg 52. In the example illustrated in FIG. 13A, the two sensor elements that are located above the same leg are arranged space apart from each other. That is, the first sensor element $30_1$ and the fourth sensor element $30_4$ located above the first leg 51 are spaced apart from each other, and the second sensor element $30_2$ and the third sensor element $30_3$ located above the second leg 52 are spaced apart from each other. This, however, is only an example. According to another example (not shown), the two sensor elements $30_1$ and $30_4$ located above the first leg 51 may be stacked one above the other above the first leg 51, and the two sensor elements $30_2$ and $30_3$ arranged on the second leg 52 may be stacked one above the other above the second leg 51.

Figure 13B:
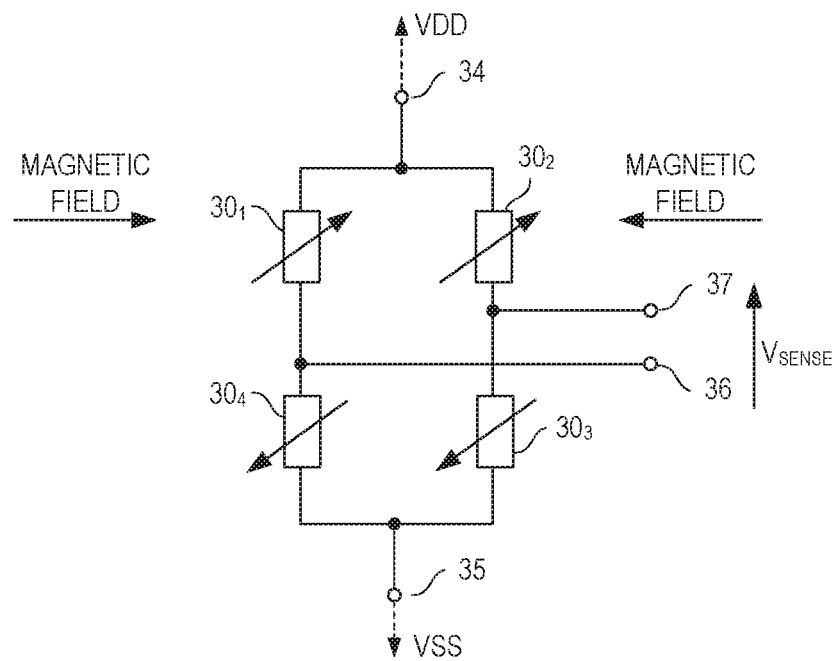
FIG. 13B shows a circuit diagram of a current sensor of the type shown in FIG. 13A.

In a current sensor with four sensor elements $30_1$-$30_4$ as illustrated in FIG. 13A (or with stacked sensor elements) the four sensor elements may be connected as illustrated in FIG. 13B. FIG. 13B shows an equivalent circuit diagram of the current sensor, wherein each of the sensor elements $30_1$-$30_4$ is represented by a variable resistor. The circuit diagram shown in FIG. 13B is very similar to the circuit diagram shown in FIG. 8. Referring to FIGS. 13A and 13B, the first and fourth sensor element $30_1$, $30_4$ located above the first leg 51 form a first series circuit connected between the first supply node 34 and the second supply node 35 and having a first tap 36, and the second and third sensor element $30_2$, $30_3$ formed above the second leg 52 form a second series circuit connected between the first supply node 34 and the second supply node 35 and having a second tap 37. According to one example, the two sensor elements forming one series circuit have different resistance characteristics and the sensor elements connected to the same supply node have the same resistance characteristic. That is, the first and second sensor element $30_1$, $30_2$ have the same resistance characteristic such that their resistance increases as the magnitude of a magnetic field with a first orientation increases and such that the resistance decreases as the magnitude of a magnetic field with a second orientation opposite the first orientation increases, and the third and fourth sensor element $30_3$, $30_4$ have the same resistance characteristic such that their resistance decreases as the magnitude of a magnetic field with the first orientation increases and such that the resistance increases as the magnitude of a magnetic field with the second orientation opposite the first orientation increases.

When a current flows through the U-shaped conductor 50 illustrated in FIG. 13A a magnetic field occurs that, in a plane parallel to the first surface 11 of the sensor chip 10, has a first field component above the first leg 51 and a second field component above the second leg 52, wherein the first and second field components have opposite orientations. Like in the example illustrated in FIG. 9, a sense voltage $V_{SENSE}$ between the first tap 36 and the second tap 37 has a quiescent level. In a topology as shown in FIGS. 13A and 13B, this quiescent level is widely independent of a (homogenous) magnetic field that is sensed by each of the sensors $30_1$-$30_4$, as such magnetic field causes an equivalent variation of the electric potentials at the first and second tap 36, 37. Thus, this topology is robust against common mode disturbances. A current through the conductor 50, however, that causes magnetic field components with different orientations above the first and second leg 51, 52, causes a deviation of the level of the sense voltage $V_{SENSE}$ from the quiescent level in such a way that a sign of a difference between the sense voltage level $V_{SENSE}$ and the quiescent level is dependent on a current direction and a magnitude is dependent on the current level of the current through the conductor 50.

Figure 14A:
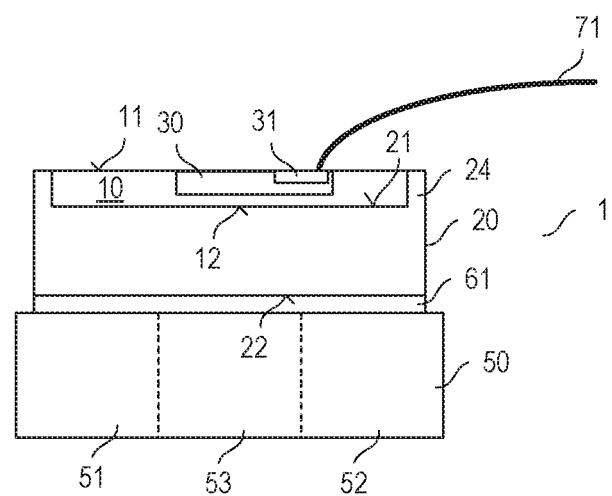
FIGS. 14A-14B illustrate further method steps that follow the mounting of the current sensor onto the conductor.

Referring to the above, the housing 20 can be configured such that it does not cover the first chip surface 11. This makes it possible to mount the current sensor 1 to the conductor 50 before electrically connecting the sensor chip 10. Referring to FIG. 14A, electrically connecting the sensor chip 10 may include connecting at least one connector 71 to a contact pad at the first chip surface 11. In FIG. 14A, only one connector 71 is schematically illustrated. It goes without saying that connecting the sensor chip 10 includes connecting as many connectors to the sensor chip 10 as needed so that each contact pad is connected to a connector at the first chip surface 11. According to one example, the at least one connector 71 is bond wire. In FIG. 14A only one section of such bond wire 71 is illustrated, namely that section that is connected to the first chip surface 11. In FIG. 14A, one contact pad 31 of the at least one sensor element is schematically illustrated. This contact pad 31 is either a contact pad configured to receive a supply voltage or a contact pad configured to output the sensor signal. According to one example, the sensor chip 10 includes a sensor arrangement of the type illustrated in FIG. 9. In this example, the contact pad 31 shown in FIG. 14A may represent any of the supply nodes 34, 35 or the output nodes 36, 37 shown in FIG. 9.

In addition to supply nodes and output nodes, the sensor chip 10 may further include a contact pad connected to the conducting layer 41 shown in FIG. 5 and/or the conducting ring 42 shown in FIG. 6 and configured to connect the conducting layer 41 and/or the conducting ring 42 to a circuit node having a predefined potential, such as ground.

Figure 14B:
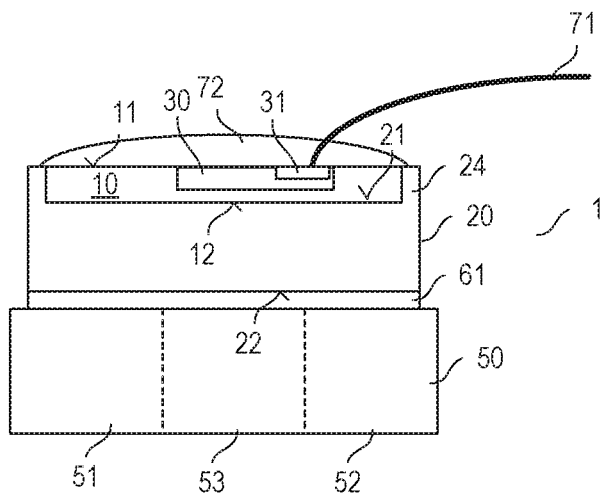

Referring to FIG. 14B, mounting the current sensor 1 to the conductor 50 may further include forming a protection layer 72 on the first chip surface 11 after forming the at least one connector 71. The protection layer 72 is an epoxy based resin, for example. According to one example, the protection layer 72 includes what is known as a "glob top".

The conductor 50 shown in FIGS. 14A and 14B can be any kind of conductor previously explained herein. That is, the conductor can be a conductor of the type explained with reference to FIG. 10 or a conductor with two legs 51, 52 and a gap 53 explained with reference to FIG. 13 (and illustrated in dashed lines in FIGS. 14A and 14B).

Figure 15A:
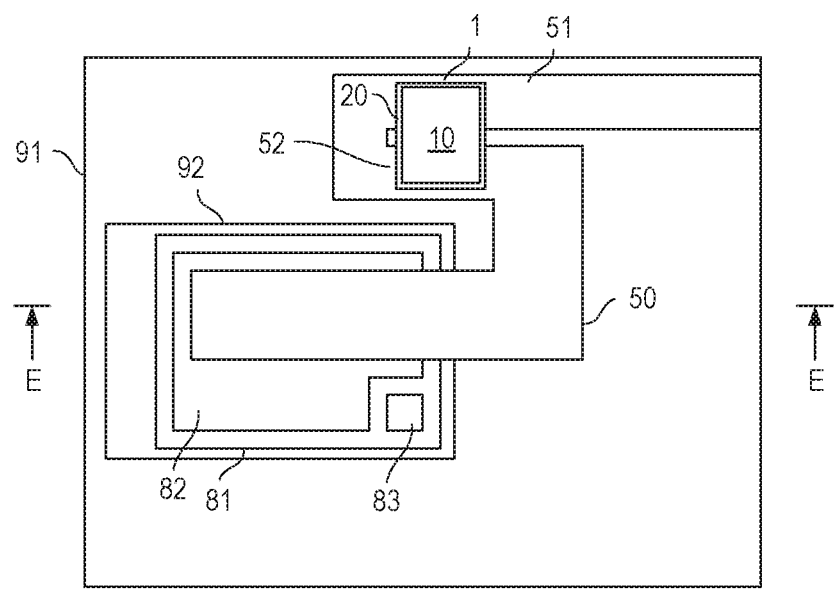
FIGS. 15A-15B show one example of an arrangement including a power semiconductor device and a current sensor configured to measure a current through the power semiconductor device.
Figure 15B:
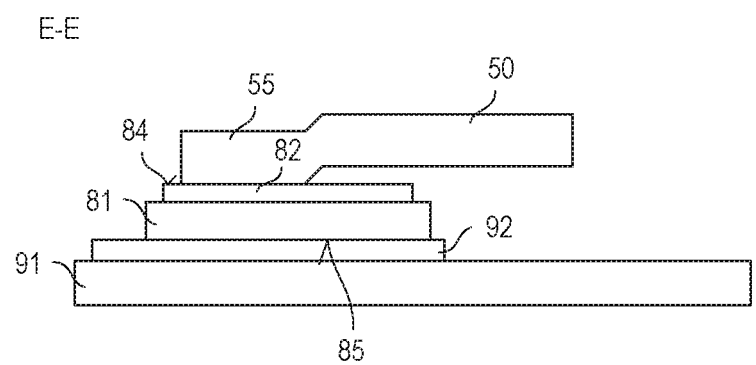

FIGS. 15A and 15B illustrate one example of how a current sensor 1 of the type previously explained herein can be used to measure a current through a power semiconductor device, in particular a power transistor. In the example illustrated in FIGS. 15A and 15B, the power transistor is integrated in a semiconductor chip 81 that includes a first load pad 82 and a control pad 83 at a first chip surface 84. This semiconductor chip 81 is also referred to as power semiconductor chip in the following.

According to one example, the power transistor device integrated in the chip 81 is a MOSFET or an IGBT and the first load pad 82 is connected to a source region (which, in the case of an IGBT, is also referred to as emitter region) of the MOSFET or IGBT. In this example, the control pad 83 is connected to a gate electrode of the MOSFET or IGBT. Further, a drain region of the MOSFET or IGBT is formed by a region adjoining a second chip surface 85, wherein this second chip surface 85 is electrically connected to an electrically conducting carrier 92, wherein the carrier 92 is arranged on an electrically insulating substrate 91. According to one example, the carrier 92 is a copper layer and the substrate 91 is a ceramic layer. In this example, the substrate 91 and the carrier 92 form a DCB substrate. The second chip surface 85 can be connected to the carrier by one of soldering, or gluing. A connection layer, such as a solder layer or a glue, however, is not illustrated in FIG. 15.

In the example illustrated in FIGS. 15A and 15B, the conductor 50 has a contact region 55 that is electrically connected to the first load pad 82. Electrically connecting the contact region 55 to the first load pad 82 may include one of soldering, or gluing. A solder layer or a glue layer, however, is not illustrated in FIG. 15B. Referring to FIG. 15A, the conductor 50 may include two legs 51, 52 as explained herein before.

It should be noted that FIGS. 15A and 15B only show one section of an overall circuit that includes the power semiconductor device and the current sensor 10. The current sensor 10 is configured to measure a current flowing via the conductor 50 into the power semiconductor device. Other parts of the circuit such as a load connected to the power semiconductor device or a control circuit connected to the control pad 83 and configured to switch on or switch off the power semiconductor device are not shown in FIGS. 15A and 15B.

Figure 16A:
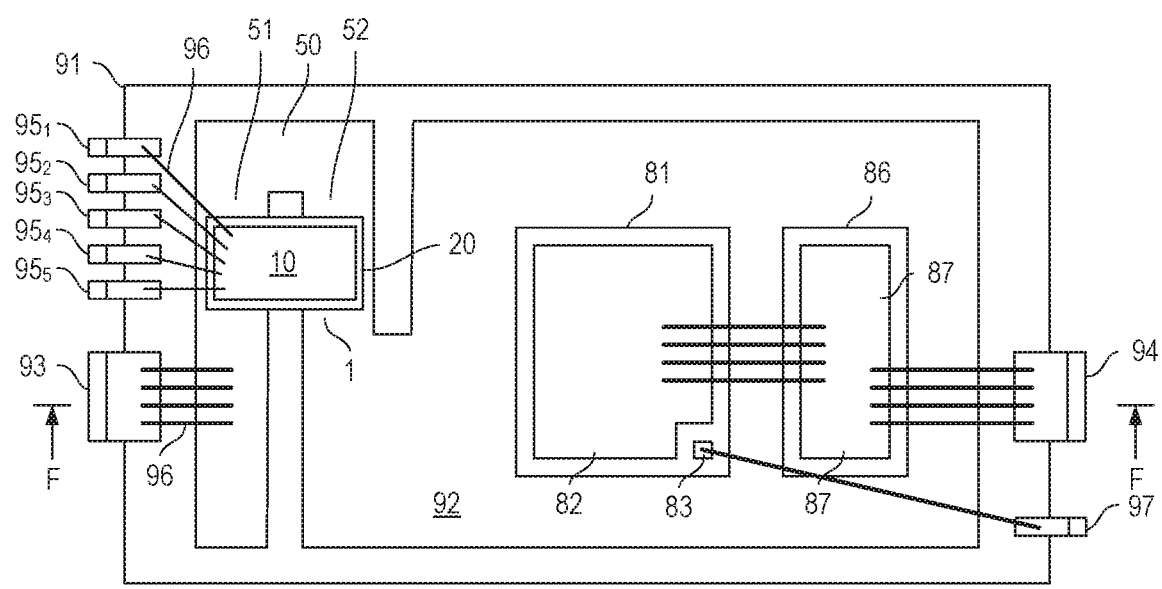
FIGS. 16A-16B illustrate another example of an arrangement including a power semiconductor device and a current sensor.
Figure 16B:
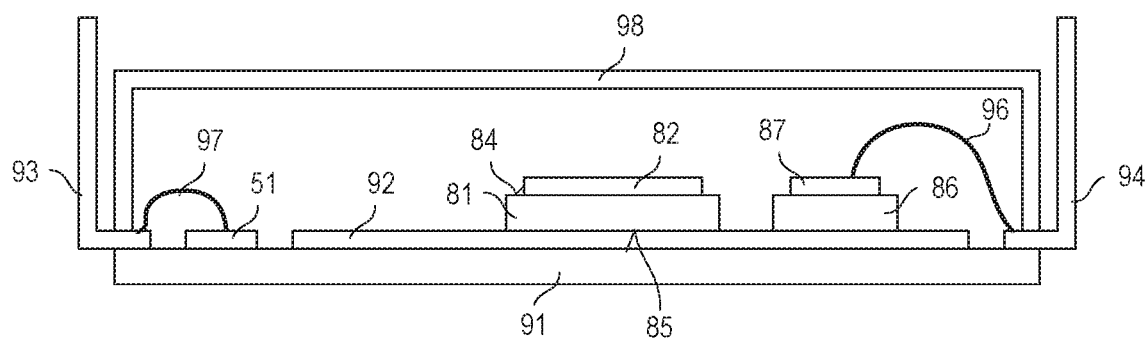

FIGS. 16A and 16B show an arrangement with a power semiconductor device integrated in a power semiconductor chip 81 and a current sensor 10 according to another example. In this example, the conductor 50 is formed by a section of the conducting carrier 92 on which the second surface 85 of the power semiconductor chip 81 is mounted. Mounting the semiconductor chip 81 onto the electrically conducting carrier 92 may include one of soldering, or gluing. A solder layer or glue however, is not shown in FIG. 15B. Like in the example explained with reference to FIGS.

14A and 14B, the power semiconductor device integrated in the power semiconductor chip 81 can be one of a MOSFET or an IGBT.

According to one example, a power diode integrated in a further power semiconductor chip 86 is connected in parallel with the power transistor device integrated in the power semiconductor chip 81. The further semiconductor chip 86 includes a first load pad 87 on a first chip surface. This load pad 87 is electrically connected to the first load pad 82 of the power transistor device. An electrical connection between the first load pad 81 of the power transistor device and the power diode is formed by bond wires (as schematically illustrated in FIG. 16A) or by a contact clip (not shown). The first load pad 87 of the further power semiconductor chip 86 forms one of an anode node and a cathode node of the power diode. A second chip surface of this further power semiconductor chip 86 forms the other one of the anode node and the cathode node and is electrically connected to and mounted on the conducting carrier 92.

The conducting carrier 92 is connected to a first terminal 93 and the first load pads 82, 87 of the power semiconductor chips 81, 86, are connected to a second terminal 94. Further, contact pads of the current sensor 1 are connected to further terminals $95_1$-$95_5$ and the control pad 83 of the power transistor device is connected to another terminal 97. These terminals 93-97 protrude from a housing that encapsulates the power semiconductor chips 81, 86 and the current sensor 1. The electrically insulating substrate 91 forms a part of this housing in this example. The housing is completed by an electrically insulating cover 98.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

The invention claimed is:

1. A current sensor, comprising:
a sensor chip comprising a first chip surface, a second chip surface, and at least one sensor element; and
a housing comprising a first housing surface adjoining the second chip surface and a second housing surface spaced apart from the first housing surface and separated from the first housing surface by a spacer section of the housing,
wherein the second housing surface is configured to be mounted on a conductor and is electrically insulating, and
wherein the housing comprises a receptacle, the receptacle comprising the first housing surface which is a bottom surface of the receptacle and vertical surfaces that intersect with the first housing surface, wherein the sensor chip is disposed within the receptacle such that outer edge sides of the sensor chip directly contact the vertical surfaces.

2. The current sensor of claim 1, wherein the housing comprises a molding compound.

3. The current sensor of claim 1, wherein the second chip surface is electrically conducting.

4. The current sensor of claim 3, wherein the second chip surface is formed by a metal layer.

5. The current sensor of claim 3, wherein the second chip surface is formed by a doped semiconductor layer.

6. The current sensor of claim 3, further comprising:
a ring shaped conductor formed on top of or in the first chip surface and electrically connected to the second chip surface.

7. The current sensor of claim 1, wherein the at least one sensor element comprises at least one contact pad in the first chip surface.

8. The current sensor of claim 6, wherein the at least one sensor element comprises at least one contact pad in the first chip surface, and comprising a further contact electrically connected to the ring shaped conductor.

9. The current sensor of claim 1, wherein the at least one sensor element is selected from the group consisting of:
Anisotropic Magneto-Resistive (AMR) sensor;
Colossal Magneto-Resistive (CMR) sensor;
Extraordinary Magneto-Resistive (EMR) sensor;
Giant Magneto-Resistive (GMR) sensor;
Tunneling Magneto-Resistive (TMR) sensor; and
Hall sensor.

10. The current sensor of claim 1, wherein the sensor chip comprises at least two sensor elements.

11. The current sensor of claim 1, wherein the sensor chip is not covered by the housing at the first chip surface.

12. The current sensor of claim 11, further comprising:
a protection layer on top of the first chip surface.

13. A method comprising:
mounting a current sensor onto a conductor,
wherein the current sensor comprises:
a sensor chip comprising a first chip surface, a second chip surface, and at least one sensor element; and
a housing comprising a first housing surface adjoining the second chip surface and a second housing surface spaced apart from the first housing surface and separated from the first housing surface by a spacer section of the housing, and
wherein the housing comprises a receptacle, the receptacle comprising the first housing surface which is a bottom surface of the receptacle and vertical surfaces that intersect with the first housing surface, wherein the sensor chip is disposed within the receptacle such that outer edge sides of the sensor chip directly contact the vertical surfaces,
and wherein mounting the current sensor onto the conductor comprises: mounting the second housing surface onto the conductor.

14. The method of claim 13, wherein mounting the second housing surface onto the conductor comprises gluing the second housing surface to the conductor.

15. The method of claim 13,
wherein the conductor comprises a U-shaped section with a first leg and a second leg that are essentially parallel, and
wherein mounting the second housing surface onto the conductor comprises mounting the second housing surface onto both the first leg and the second leg.

16. The method of claim 13,
wherein the sensor chip is not covered by the housing at the first chip surface,
wherein the first chip surface of the sensor chip comprises at least one contact pad, and
wherein the method further comprises, after mounting the current sensor onto the conductor, connecting a connector to the at least one contact pad.

17. The method of claim 16, wherein the connector is one of a bond wire and a flat conductor.

18. The method of claim 16, further comprising:
forming a protection layer on the first chip surface after connecting the connector to the at least one contact pad.

19. The current sensor of claim 1, wherein the housing is formed of electrically insulating mold compound, and wherein the spacer section of the housing is a section of the electrically insulating mold compound that is disposed on one side of the sensor chip and extends from the first housing surface to the second housing surface.

20. The method of claim 13, wherein the housing is formed of electrically insulating mold compound, and wherein the spacer section of the housing is a section of the electrically insulating mold compound that is disposed on one side of the sensor chip and extends from the first housing surface to the second housing surface.

* * * * *